US010637395B2

(12) United States Patent
Shahmohammadi et al.

(10) Patent No.: US 10,637,395 B2
(45) Date of Patent: Apr. 28, 2020

(54) RESONATOR CIRCUIT

(71) Applicant: Huawei Technologies Co., Ltd., Shenzhen (CN)

(72) Inventors: Mina Shahmohammadi, Pijnacker (NL); Masoud Babaie, Pijnacker (NL); Robert Bogdan Staszewski, Delft (NL)

(73) Assignee: Huawei Technologies Co., Ltd., Shenzhen (CN)

(*) Notice: Subject to any disclaimer, the term of this patent is extended or adjusted under 35 U.S.C. 154(b) by 186 days.

(21) Appl. No.: 15/659,204

(22) Filed: Jul. 25, 2017

(65) Prior Publication Data
US 2017/0366137 A1 Dec. 21, 2017

Related U.S. Application Data

(63) Continuation of application No. PCT/EP2015/051573, filed on Jan. 27, 2015.

(51) Int. Cl.
*H03B 5/12* (2006.01)

(52) U.S. Cl.
CPC ......... *H03B 5/1228* (2013.01); *H03B 5/1218* (2013.01); *H03B 5/1243* (2013.01);
(Continued)

(58) Field of Classification Search
CPC .. H03B 5/1228; H03B 5/1265; H03B 5/1293; H03B 5/1218; H03B 5/1296; H03B 5/1262; H03B 5/1243; H03B 2201/0266
(Continued)

(56) References Cited

U.S. PATENT DOCUMENTS

| 6,606,008 B2 | 8/2003 | Traub |
| 2004/0189487 A1 | 9/2004 | Hoefel et al. |

(Continued)

FOREIGN PATENT DOCUMENTS

| CN | 1532372 A | 9/2004 |
| CN | 103299541 A | 9/2013 |
| CN | 103762859 A | 4/2014 |

OTHER PUBLICATIONS

Babaie et al., "A Class-F CMOS Oscillator," IEEE Journal of Solid-State Circuits, vol. 48, No. 12, pp. 3120-3133, Institute of Electrical and Electronic Engineers, New York, New York (Dec. 2013).
(Continued)

*Primary Examiner* — Arnold M Kinkead
(74) *Attorney, Agent, or Firm* — Leydig, Voit & Mayer, Ltd.

(57) ABSTRACT

The invention relates to a resonator circuit, the resonator circuit comprising a transformer comprising a primary winding and a secondary winding, wherein the primary winding is inductively coupled with the secondary winding, a primary capacitor being connected to the primary winding, the primary capacitor and the primary winding forming a primary circuit, and a secondary capacitor being connected to the secondary winding, the secondary capacitor and the secondary winding forming a secondary circuit, wherein the resonator circuit has a common mode resonance frequency at an excitation of the primary circuit in a common mode, wherein the resonator circuit has a differential mode resonance frequency at an excitation of the primary circuit in a differential mode, and wherein the common mode resonance frequency is different from the differential mode resonance frequency.

18 Claims, 11 Drawing Sheets

(52) U.S. Cl.
CPC ......... *H03B 5/1262* (2013.01); *H03B 5/1265* (2013.01); *H03B 5/1293* (2013.01); *H03B 5/1296* (2013.01); *H03B 2201/0266* (2013.01)

(58) Field of Classification Search
USPC .............................. 331/167, 117 FE, 177 V
See application file for complete search history.

(56) References Cited

U.S. PATENT DOCUMENTS

| | | | |
|---|---|---|---|
| 2009/0195324 A1* | 8/2009 | Li | H01F 19/04 333/25 |
| 2011/0018644 A1 | 1/2011 | Yun et al. | |
| 2012/0161890 A1 | 6/2012 | Li et al. | |
| 2013/0309983 A1 | 11/2013 | Ashckenazi et al. | |
| 2014/0077890 A1 | 3/2014 | Babaie et al. | |
| 2014/0357206 A1* | 12/2014 | Tsai | H03H 7/48 455/127.1 |
| 2016/0099681 A1* | 4/2016 | Zong | H03B 5/1215 331/117 FE |

OTHER PUBLICATIONS

Baek et al., "A Dual-Band (13/22-GHz) VCO Based on Resonant Mode Switching," IEEE Microwave and Wireless Components Letters, vol. 13, No. 10, pp. 443-445, Institute of Electrical and Electronics Engineers, New York, New York (Oct. 2003).
Babaie et al., "Third-Harmonic Injection Technique Applied to a 5.87-to-7.56GHz 65nm CMOS Class-F Oscillator with 192dBc/Hz FOM," ISSCC, Session 20, Frequency Generation, 20.2, Institute of Electrical and Electronics Engineers, New York, New York (2013).
Bevilacqua, "Transformer-Based Dual-Mode Voltage-Controlled Oscillators," IEEE Transactions on Circuits and Systems—II: Express Briefs, vol. 54, No. 4, pp. 293-297, Institute of Electrical and Electronic Engineers, New York, New York (Apr. 2007).
Hoshino et al., "A 1.5V, 1.7mA 700 MHz CMOS LC Oscillator with no Upconverted Flicker Noise," IEEE Transactions on Circuits Conference, Institute of Electrical and Electronics Engineers, New York, New York (2001).
Ismail et al., "CMOS Differential LC Oscillator with Suppressed Up-Converted Flicker Noise," IEEE International Solid-State Circuits Conference, Salon 9, Institute of Electrical and Electronics Engineers, (Feb. 10, 2003).
Yun et al., "RF CMOS LC-Oscillator with Source Damping Resistors," IEEE Microwave and Wireless Components Letters, vol. 16, No. 9, pp. 511-513, Institute of Electrical and Electronics Engineers, New York, New York (Sep. 2006).
Groszkowski, "The interdependence of Frequency Variation and Harmonic Content, and the Problem of Constant-Frequency Oscillators," Proceedings of the Institute of Radio Engineers, vol. 21, No. 7, pp. 958-981, Institute of Electrical and Electronic Engineers, New York, New York (Jul. 1933).
Pepe et al., "Suppression of Flicker Noise Up-Conversion in a 65-nm CMOS VCO in the 3.0-3.6 GHz Band," IEEE Journal of Solid-State Circuits, vol. 48, No. 10, pp. 2375-2389, Institute of Electrical and Electronics Engineers, New York, New York (Oct. 2013).
EP/15701524.9-1206, Office Action dated Jan. 2, 2020.

* cited by examiner

RESONATOR CIRCUIT

CROSS-REFERENCE TO RELATED APPLICATIONS

This application is a continuation of International Application No. PCT/EP2015/051573, filed on Jan. 27, 2015, the disclosure of which is hereby incorporated by reference in its entirety.

TECHNICAL FIELD

The invention relates to the field of radio frequency (RF) resonator circuits.

BACKGROUND

Resonator circuits, also denoted as tank circuits, are widely used as frequency selective elements in a variety of radio frequency components, such as filters, amplifiers, and oscillators. Typically, resonator circuits comprise inductors and capacitors, wherein the inductors and capacitors are connected to be in resonance at a specific resonance frequency. The quality of resonator circuits is thereby characterized by a quality factor. The characteristics of resonator circuits are of major interest in the design of radio frequency oscillators, in particular when implemented as radio frequency integrated circuits (RFICs) on semiconductor substrates. In particular, the response of the resonator circuits with regard to leakage currents or currents at harmonic frequencies can have a major impact on the frequency stability and phase noise performance of the radio frequency oscillators.

Common resonator circuits exhibit a resistive characteristic when excited at the resonance frequency, and a capacitive characteristic when excited at frequencies above the resonance frequency. Consequently, higher order current components in conjunction with the Groszkowski effect may lead to reduced frequency stability and increased flicker noise up-conversion, i.e. reduced close-in phase noise performance, of radio frequency oscillators.

For improving the phase noise performance of radio frequency oscillators, noise filtering techniques are applied. These techniques rely on interposing a further resonator circuit having a resonance frequency at $2\omega_0$ in a common source of the transistors, e.g. core transistors. These techniques, however, use an additional tunable inductor and increase the die area on the semiconductor substrate.

For reducing an amount of higher order drain current harmonics, resistors are added in series with the sources of the transistors for linearizing the operation of the transistors. However, the radio frequency oscillator start-up margin is usually reduced.

By adding resistors in series with the drain of the transistors, the resistance in conjunction with a parasitic drain capacitance can introduce a delay in a loop gain for shifting both an impulse sensitivity function (ISF) and a current waveform of the radio frequency oscillators. Flicker noise up-conversion is reduced by specifically tailoring the component values. However, the phase noise performance in the 20 dB/decade region is degraded particularly at low supply voltages and high current consumptions.

In J. Groszkowski, "The interdependence of frequency variation and harmonic content, and the problem of constant-frequency oscillators," Proc. IRE, vol. 21, no. 7, pp. 958-981, July 1934, the Groszkowski effect is studied.

In M. Babaie and R. B. Staszewski, "A class-F CMOS oscillator," IEEE JSSC, vol. 48, no. 12, pp. 3120-3133, December 2013, a resonator circuit and a radio frequency oscillator are described.

SUMMARY

It is an object of the invention to provide an efficient resonator circuit.

The invention is based on the finding that a transformer-based resonator circuit can be employed exhibiting different characteristics when excited in a differential mode and in a common mode. In particular, the inductive coupling factor of the transformer may be different in differential mode and common mode excitations, wherein a differential mode resonance frequency can be different from a common mode resonance frequency. In particular, the common mode resonance frequency can be designed to be twice the differential mode resonance frequency.

The resonator circuit enables an efficient operation of a radio frequency oscillator. In particular, a second harmonic can be exposed to a resistive path provided by the resonator circuit. Consequently, the Groszkowski effect can be mitigated and frequency stability and phase noise performance of the radio frequency oscillator can be improved.

The resonator circuit and the radio frequency oscillator are suited for implementation as radio frequency integrated circuits (RFICs) on semiconductor substrates.

According to a first aspect, the invention relates to a resonator circuit, the resonator circuit comprising a transformer comprising a primary winding and a secondary winding, wherein the primary winding is inductively coupled with the secondary winding, a primary capacitor being connected to the primary winding, the primary capacitor and the primary winding forming a primary circuit, and a secondary capacitor being connected to the secondary winding, the secondary capacitor and the secondary winding forming a secondary circuit, wherein the resonator circuit has a common mode resonance frequency at an excitation of the primary circuit in a common mode, wherein the resonator circuit has a differential mode resonance frequency at an excitation of the primary circuit in a differential mode, and wherein the common mode resonance frequency is different from the differential mode resonance frequency. Thus, an efficient resonator circuit is provided.

The resonator circuit can be a tank circuit. The resonator circuit can be used as a frequency selective element within a radio frequency oscillator. The resonator circuit can be resonant when excited in the differential mode and in the common mode.

The primary winding and the secondary winding can be arranged to provide a strong inductive coupling when the primary circuit is excited in the differential mode and a weak inductive coupling when the primary circuit is excited in the common mode.

The primary capacitor can comprise a pair of single-ended capacitors being connected in series to form the primary capacitor. The primary capacitor can be regarded as a primary capacitive structure. The secondary capacitor can comprise a pair of differential capacitors being connected in series to form the secondary capacitor. The secondary capacitor can be regarded as a secondary capacitive structure.

The resonance frequency in differential mode, i.e. the differential mode resonance frequency, can depend on the inductance of the primary winding, the capacitance of the primary capacitor, the inductance of the secondary winding, and the capacitance of the secondary capacitor. The resonance frequency in common mode, i.e. the common mode resonance frequency, can depend on the inductance of the primary winding and the capacitance of the primary capacitor. The resonance frequency in common mode, i.e. the common mode resonance frequency, may be independent from the inductance of the secondary winding, and the capacitance of the secondary capacitor. Odd order harmonic components of the current injected into the resonator circuit can be differential mode signals and even order harmonic components can be common mode signals.

In a first implementation form of the resonator circuit according to the first aspect as such, the common mode resonance frequency is twice the differential mode resonance frequency. Thus, a resistive path for a second harmonic at an excitation of the primary circuit in the common mode is realized.

In a second implementation form of the resonator circuit according to the first aspect as such or any preceding implementation form of the first aspect, the resonator circuit has a further differential mode resonance frequency at an excitation of the primary circuit in the differential mode, wherein the further differential mode resonance frequency is different from the differential mode resonance frequency and the common mode resonance frequency. Thus, a further differential mode resonance at the further differential mode resonance frequency is realized.

In a third implementation form of the resonator circuit according to the second implementation form of the first aspect, the further differential mode resonance frequency is three times the differential mode resonance frequency. Thus, a resistive path for a third harmonic at an excitation of the primary circuit in the differential mode is realized. The further differential mode resonance frequency can specifically be designed to be three times the differential mode resonance frequency.

In a fourth implementation form of the resonator circuit according to the first aspect as such or any preceding implementation form of the first aspect, the primary winding of the transformer comprises one turn, and the secondary winding of the transformer comprises two turns. Thus, the resonator circuit is implemented efficiently.

The number of turns of the secondary winding can be twice the number of turns of the primary winding. Thereby, a ratio of turns of the primary winding and the secondary winding of 1:2 can be realized.

In a fifth implementation form of the resonator circuit according to the first aspect as such or any preceding implementation form of the first aspect, the primary winding of the transformer and/or the secondary winding of the transformer is planar. Thus, the resonator circuit is implemented efficiently.

In a sixth implementation form of the resonator circuit according to the first aspect as such or any preceding implementation form of the first aspect, the primary winding of the transformer and the secondary winding of the transformer are arranged on the same plane. Thus, the resonator circuit is implemented efficiently.

The primary winding of the transformer and/or the secondary winding of the transformer can comprise a bridging portion being arranged at a different plane.

In a seventh implementation form of the resonator circuit according to the first aspect as such or any preceding implementation form of the first aspect, the primary winding of the transformer and/or the secondary winding of the transformer is connected to a constant voltage source or a ground potential. Thus, a tapping of the primary winding and/or the secondary winding is realized. Both the primary winding and the secondary winding may be connected to a constant voltage source respectively in order to enable an efficient start-up of the resonator circuit.

The tapping of the primary winding and/or the secondary winding can be a symmetrical center tapping of the primary winding and/or the secondary winding.

In an eighth implementation form of the resonator circuit according to the first aspect as such or any preceding implementation form of the first aspect, the primary capacitor of the primary circuit comprises a pair of single-ended capacitors. Thus, a reference to ground potential of the primary circuit is realized. The pair of single-ended capacitors can have the same capacitance as the primary capacitor. A single-ended capacitor can be realized as a plurality of switched capacitors, wherein the plurality of switched capacitors can be arranged in parallel. The capacitances of the switched capacitors can be different.

In a ninth implementation form of the resonator circuit according to the first aspect as such or any preceding implementation form of the first aspect, the secondary capacitor of the secondary circuit comprises a pair of differential capacitors. Thus, a reference to ground potential of the secondary circuit is avoided. A differential capacitor can be realized as a plurality of switched capacitors, wherein the plurality of switched capacitors can be arranged in parallel. The pair of differential capacitors can be a pair of balanced capacitors.

In a tenth implementation form of the resonator circuit according to the first aspect as such or any preceding implementation form of the first aspect, the primary capacitor and/or the secondary capacitor comprises a variable capacitor, in particular a digitally tunable capacitor. Thus, a variation of the differential mode resonance frequency and/or the common mode resonance frequency can be realized efficiently.

In an eleventh implementation form of the resonator circuit according to the first aspect as such or any preceding implementation form of the first aspect, the primary capacitor is connected in parallel to the primary winding, and/or the secondary capacitor is connected in parallel to the secondary winding. Thus, the resonator circuit is implemented efficiently.

According to a second aspect, the invention relates to a radio frequency oscillator, the radio frequency oscillator comprising a resonator circuit according to the first aspect as such or any implementation form of the first aspect, and an excitation circuit being configured to excite the primary circuit of the resonator circuit in the differential mode. Thus, an efficient radio frequency oscillator is provided.

The radio frequency oscillator can exhibit improved frequency stability and phase noise performance, e.g. close-in phase noise performance. In particular, flicker noise up-conversion due to the Groszkowski effect can be mitigated efficiently. The approach may be effective to mitigate a 1/f phase noise up-conversion and may therefore improve a $1/f^3$ phase noise characteristic. A $1/f^2$ phase noise characteristic may be unchanged.

Further features of the radio frequency oscillator directly result from the functionality of the resonator circuit according to the first aspect as such or any implementation form of the first aspect.

In a first implementation form of the radio frequency oscillator according to the second aspect as such, the excitation circuit comprises at least one transistor, in particular at least one field-effect transistor, for exciting the primary circuit of the resonator circuit. Thus, an active device is employed for exciting the primary circuit of the resonator circuit. In order to realize a cross-coupled oscillator structure at least two transistors may be employed. The transistors can be metal-oxide-semiconductor field-effect transistors (MOSFETs).

In a second implementation form of the radio frequency oscillator according to the second aspect as such or any preceding implementation form of the second aspect, the radio frequency oscillator is a class F oscillator. Thus, an efficient oscillator structure is applied.

Within the class F oscillator, a first harmonic and a third harmonic can be excited in order to obtain a pseudo square-wave oscillation waveform. Within the class F oscillator, the third harmonic may not be filtered due to the further differential mode resonance frequency. The oscillation signal can have a pseudo square-wave oscillation waveform.

According to a third aspect, the invention relates to a method for exciting a resonator circuit, the resonator circuit comprising a transformer comprising a primary winding and a secondary winding, wherein the primary winding is inductively coupled with the secondary winding, a primary capacitor being connected to the primary winding, the primary capacitor and the primary winding forming a primary circuit, and a secondary capacitor being connected to the secondary winding, the secondary capacitor and the secondary winding forming a secondary circuit, wherein the resonator circuit has a common mode resonance frequency at an excitation of the primary circuit in a common mode, wherein the resonator circuit has a differential mode resonance frequency at an excitation of the primary circuit in a differential mode, and wherein the common mode resonance frequency is different from the differential mode resonance frequency, the method comprising exciting the primary circuit of the resonator circuit in the differential mode. Thus, an efficient excitation of the resonator circuit is realized.

The method can be performed by the resonator circuit and/or the radio frequency oscillator. Further features of the method directly result from the functionality of the resonator circuit and/or the radio frequency oscillator.

The invention can be implemented using hardware and/or software.

SHORT DESCRIPTION OF DRAWINGS

Embodiments of the invention will be described with respect to the following figures, in which.

DETAILED DESCRIPTION

Figure 1:
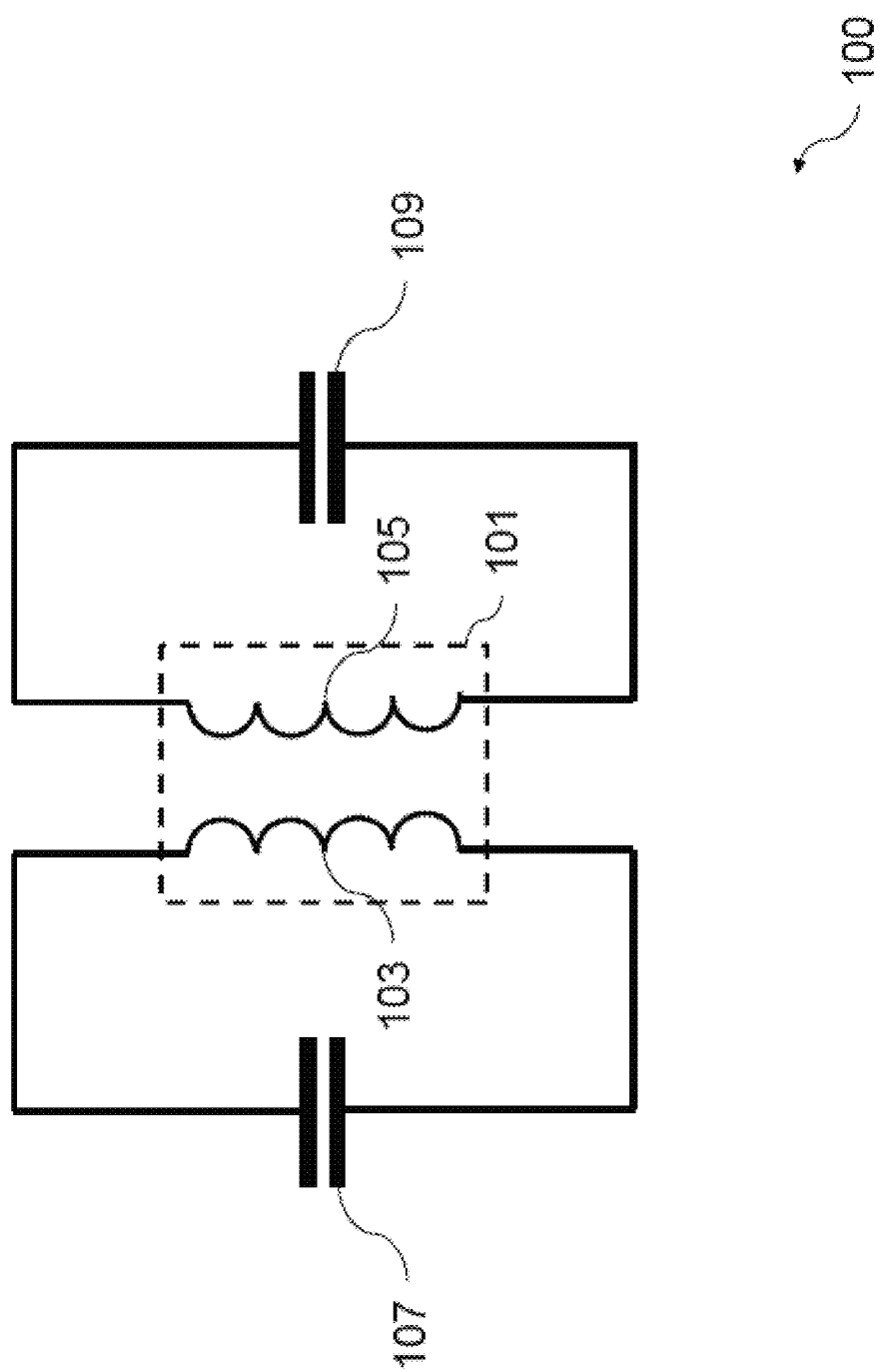
FIG. 1 shows a diagram of a resonator circuit according to an embodiment.

FIG. 1 shows a diagram of a resonator circuit 100 according to an embodiment. The resonator circuit 100 comprises a transformer 101 comprising a primary winding 103 and a secondary winding 105, wherein the primary winding 103 is inductively coupled with the secondary winding 105, a primary capacitor 107 being connected to the primary winding 103, the primary capacitor 107 and the primary winding 103 forming a primary circuit, and a secondary capacitor 109 being connected to the secondary winding 105, the secondary capacitor 109 and the secondary winding 105 forming a secondary circuit, wherein the resonator circuit 100 has a common mode resonance frequency at an excitation of the primary circuit in a common mode, wherein the resonator circuit 100 has a differential mode resonance frequency at an excitation of the primary circuit in a differential mode, and wherein the common mode resonance frequency is different from the differential mode resonance frequency. In an embodiment, the common mode resonance frequency is twice the differential mode resonance frequency.

The resonator circuit 100 can be a tank circuit. The resonator circuit 100 can be used as a frequency selective element within a radio frequency oscillator. The resonator circuit 100 can be resonant when excited in the differential mode and in the common mode.

The primary winding 103 and the secondary winding 105 can be arranged to provide a strong inductive coupling when the primary circuit is excited in the differential mode and a weak inductive coupling when the primary circuit is excited in the common mode.

The resonance frequency in differential mode, i.e. the differential mode resonance frequency, can depend on the inductance of the primary winding 103, the capacitance of the primary capacitor 107, the inductance of the secondary winding 105, and the capacitance of the secondary capacitor 109. The resonance frequency in common mode, i.e. the common mode resonance frequency, can depend on the inductance of the primary winding 103 and the capacitance of the primary capacitor 107. The resonance frequency in common mode, i.e. the common mode resonance frequency, may be independent from the inductance of the secondary winding 105, and the capacitance of the secondary capacitor 109.

The diagram illustrates the overall structure of the resonator circuit 100, wherein the primary capacitor 107 can comprise a pair of single-ended capacitors, and wherein the secondary capacitor 109 can comprise a pair of differential capacitors.

Figure 2:
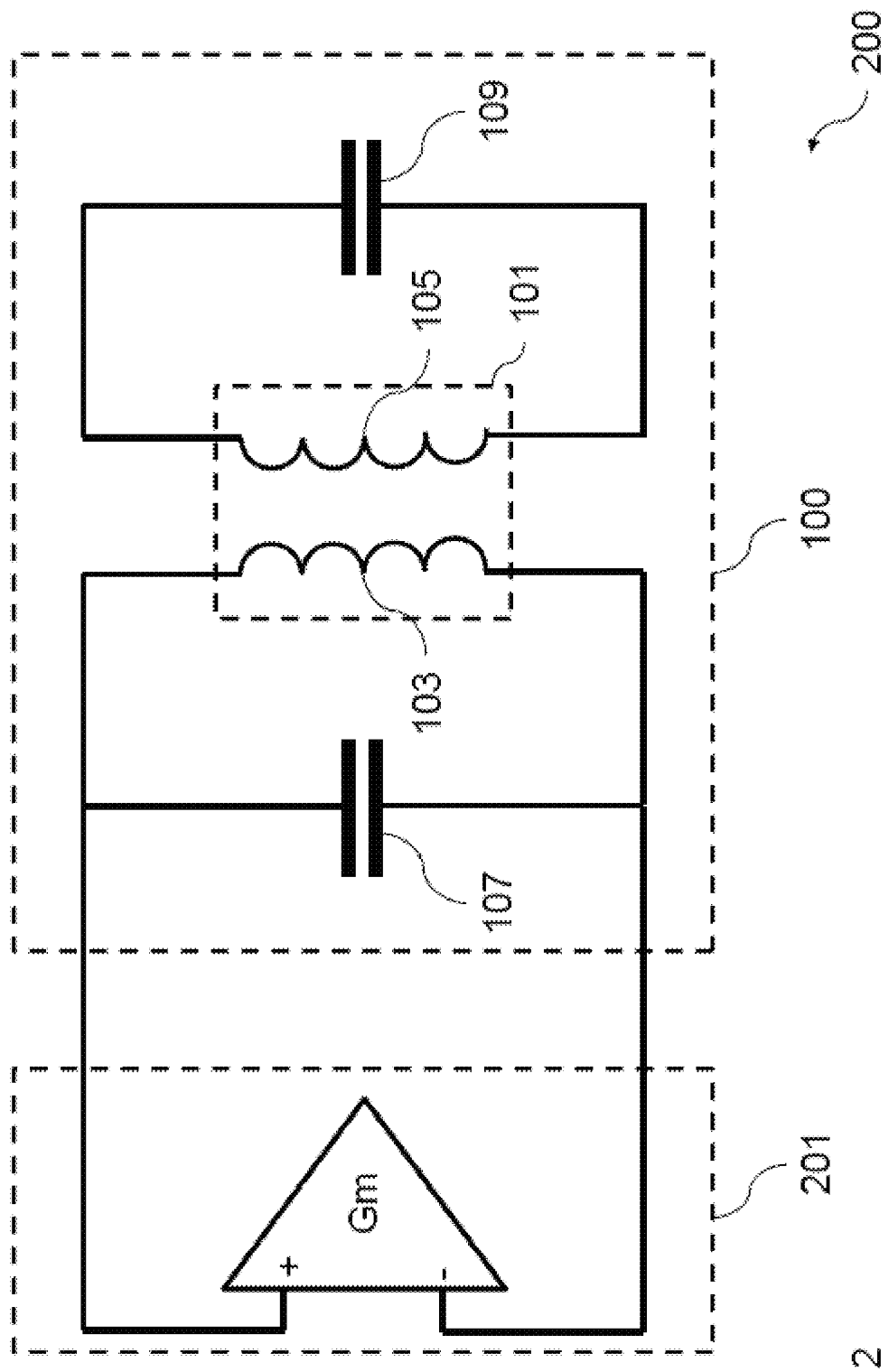
FIG. 2 shows a diagram of a radio frequency oscillator according to an embodiment.

FIG. 2 shows a diagram of a radio frequency oscillator 200 according to an embodiment. The radio frequency oscillator 200 comprises a resonator circuit 100, and an excitation circuit 201. The resonator circuit 100 comprises a transformer 101 comprising a primary winding 103 and a secondary winding 105, wherein the primary winding 103 is inductively coupled with the secondary winding 105, a primary capacitor 107 being connected to the primary winding 103, the primary capacitor 107 and the primary winding 103 forming a primary circuit, and a secondary capacitor 109 being connected to the secondary winding 105, the secondary capacitor 109 and the secondary winding 105 forming a secondary circuit, wherein the resonator circuit 100 has a common mode resonance frequency at an excitation of the primary circuit in a common mode, wherein the resonator circuit 100 has a differential mode resonance frequency at an excitation of the primary circuit in a differential mode, and wherein the common mode resonance frequency is different from the differential mode resonance frequency. The excitation circuit 201 is configured to excite the primary circuit of the resonator circuit 100 in the differential mode. The excitation circuit 201 can exemplarily comprise an exciting element, e.g. a feedback amplifier, providing a trans-conductance Gm.

In an embodiment, the excitation circuit 201 comprises at least one transistor, in particular at least one field-effect transistor, for exciting the primary circuit of the resonator circuit 100. In order to realize a cross-coupled oscillator structure at least two transistors may be employed.

In the following, further implementation forms and embodiments of the resonator circuit 100 and the radio frequency oscillator 200 are described.

An up-conversion of flicker noise, e.g. 1/f noise, can degrade a close-in spectrum of a radio frequency oscillator, e.g. a complementary metal-oxide semiconductor (CMOS) radio frequency (RF) oscillator. The resulting $1/f^3$ phase noise (PN) can further be an issue within phase-locked loops (PLLs) having a loop bandwidth of e.g. less than 1 MHz, which practically relates to the majority of cellular phones. A major flicker noise up-conversion mechanism in nanoscale CMOS is the Groszkowski effect.

The presence of harmonics in a current of an active device, such as a transistor of an excitation circuit, can cause a frequency drift of a resonance frequency of a resonator circuit, due to perturbing reactive energy in the resonator circuit. Any variation in the ratio of a higher harmonic current to a fundamental current (e.g. due to the flicker noise) can modulate the frequency drift and can show itself as a $1/f^3$ phase noise. Embodiments of the invention reduce the flicker noise up-conversion due to the Groszkowski effect in radio frequency oscillators significantly. The resonator circuit 100 can be applied for flicker noise up-conversion reduction within the radio frequency oscillator 200, wherein the radio frequency oscillator 200 can be a class F oscillator.

Figure 3:
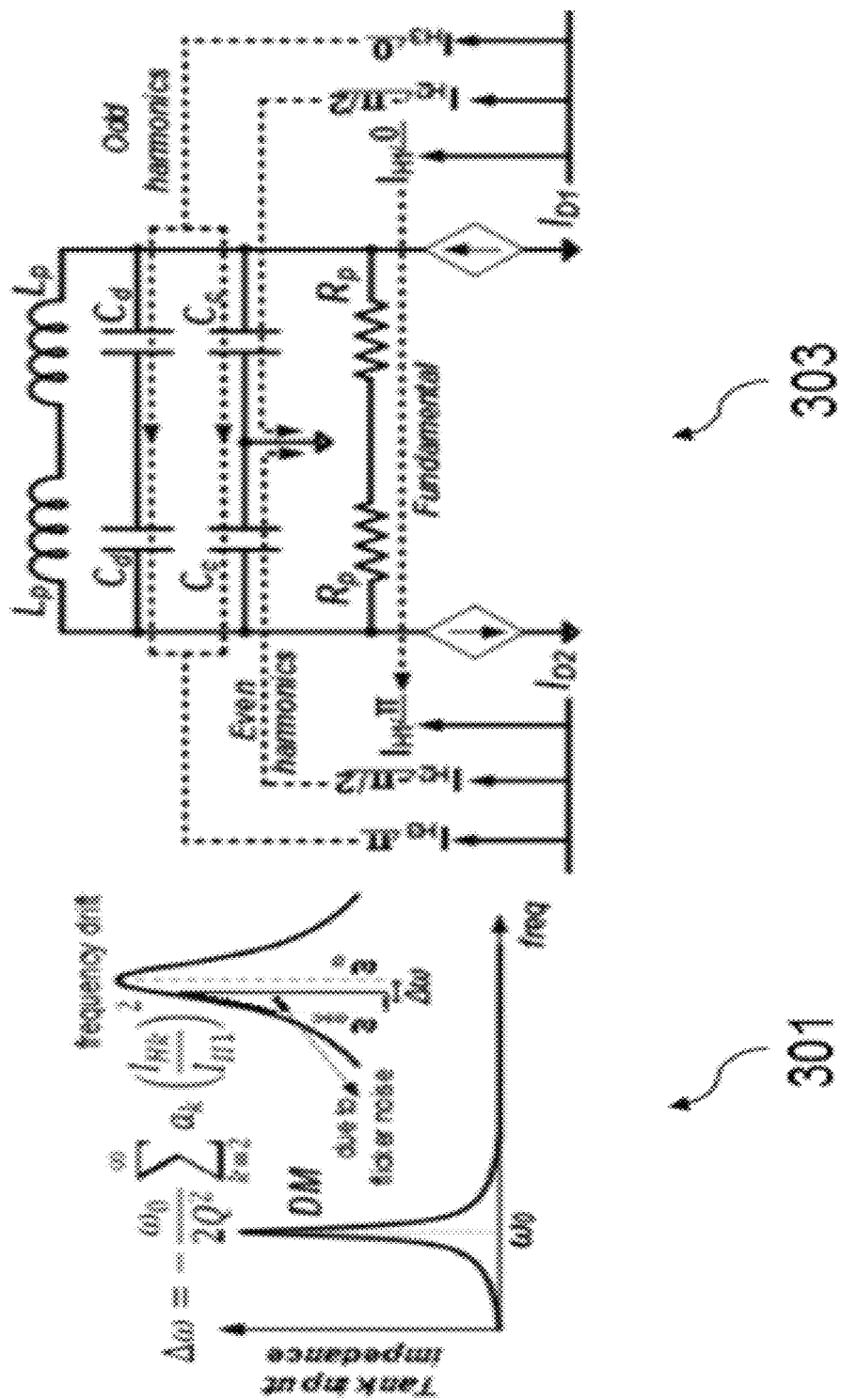
FIG. 3 shows an input impedance response and an equivalent circuit of a resonator circuit.

FIG. 3 shows an input impedance response 301 and an equivalent circuit 303 of a resonator circuit. The diagram illustrates current harmonic paths and frequency drifts for the resonator circuit without resistive traps at higher harmonics.

The presence of harmonics of a current of an active device, such as a transistor of an excitation circuit, can cause a frequency drift of a resonance frequency $\omega_0$ of a resonator circuit as depicted in FIG. 3. A fundamental drain current $I_{H1}$ can flow into the resistors having the resistance $R_p$, which can be the equivalent parallel resistance of the resonator circuit, while its second and third harmonics, $I_{H2}$ and $I_{H3}$, may mainly take the capacitance path due to its lower impedance. As a consequence, reactive energy stored in the inductors and capacitors, e.g. having inductances $L_p$ and capacitances $C_c$ and $C_d$, can be perturbed, shifting the resonance frequency $\omega_0$ and/or the oscillation frequency by $\Delta\omega$ lower in order to satisfy the resonance condition. This shift may be static but any variation in the ratio of the currents $I_{H2}$ (or $I_{H3}$) to $I_{H1}$ (e.g. due to flicker noise) can modulate $\Delta\omega$ and can show itself as a $1/f^3$ phase noise.

Figure 4:
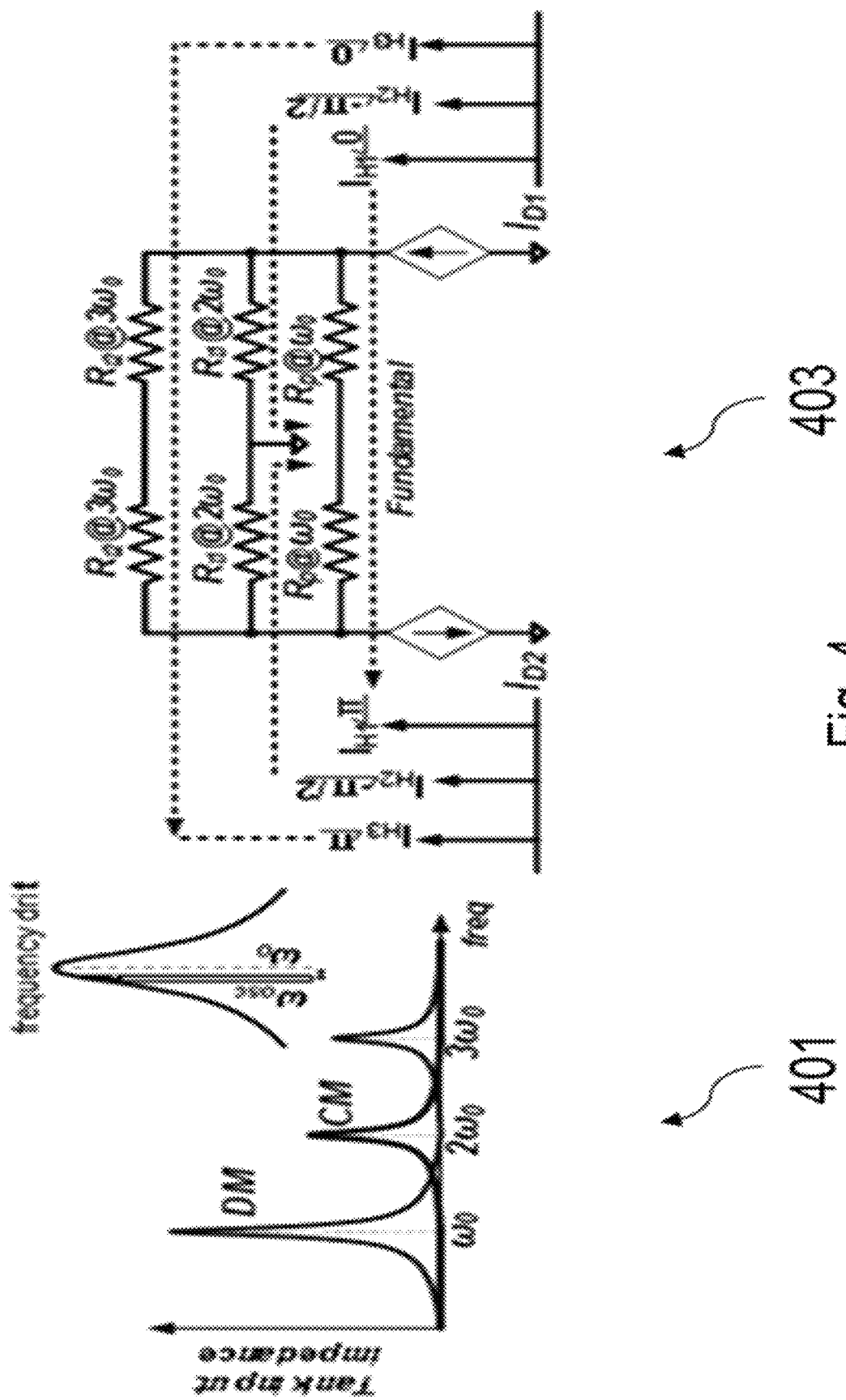
FIG. 4 shows an input impedance response and an equivalent circuit of a resonator circuit according to an embodiment.

FIG. 4 shows an input impedance response 401 and an equivalent circuit 403 of a resonator circuit 100 according to an embodiment. The diagram illustrates current harmonic paths and frequency drifts for the resonator circuit 100 with resistive traps at higher harmonics.

Suppose that the input impedance $Z_{in}$ of the resonator circuit 100 has further peaks at strong harmonics of the fundamental resonance frequency $\omega_0$. These harmonics would then mainly flow into their relative equivalent resistance of $Z_{in}$, instead of its capacitive part, as depicted in FIG. 4. Consequently, Groszewski's effect on the flicker noise up-conversion can be reduced significantly. On the other hand, flicker noise of transistors, e.g. core transistors, of an excitation circuit can modulate the second harmonic of the virtual ground of the radio frequency oscillator. This modulation can generate a second harmonic current in parasitic gate-source capacitors $C_{gs}$ and can get injected into the resonator circuit 100. Consequently, the current $I_{H2}$ can be the main contributor to the frequency drift.

In other words, a dominant source of 1/f noise up-conversion in radio frequency oscillators, in particular without tail transistors, is that current harmonics of the resonator circuits flow into the capacitive part of the resonator circuits as shown in FIG. 3. An approach for reducing the 1/f noise up-conversion is illustrated in FIG. 4. For resonance frequencies at higher harmonics, the current can flow into the equivalent resistance of the resonator circuit and 1/f noise up-conversion can be reduced. A resonator circuit 100 is generally shown in FIG. 1.

Embodiments of the invention apply a transformer-based resonator circuit topology that effectively traps the current $I_{H2}$ in its resistive part without the cost of extra die area on a semiconductor substrate. The resonator circuit 100 can derive this characteristic from a different behavior of inductors and transformers in differential mode (DM) and common mode (CM) excitations. The transformer based resonator circuit 100 can be incorporated into the radio frequency oscillator 200, e.g. a class-F oscillator, in order to take advantage of its low phase noise in the 20 dB/dec region and in order to improve the phase noise in the 30 dB/dec region.

The resonator circuit 100 can be based on the transformer 101, e.g. being a 1:2 turn transformer. The differential mode resonance frequency and the common mode resonance frequency can be different within the transformer 101, e.g. due to different coupling factors in differential mode and in common mode. An application of a switch is avoided. The resistive trap is realized by the common mode resonance.

The common mode signal that excites the common mode resonance can be the second harmonic component of the current within the resonator circuit 100. The $I_{H2}$ component can have a $\pi/2$ phase shift with regard to the fundamental current which can make it a common mode signal as illustrated in FIG. 3 and FIG. 4.

If the space of the primary winding and/or the secondary winding is designed accurately and a ratio $C_s/C_p$ is chosen accurately, the common mode resonance frequency can be two times the differential mode resonance frequency. Then, the common mode second harmonic current component can flow into the equivalent resistance of the resonant peak and may not flow through the capacitive part. This approach mitigates disturbances of the reactive energy in the capacitive part and reduces the 1/f noise up-conversion.

Figure 5:
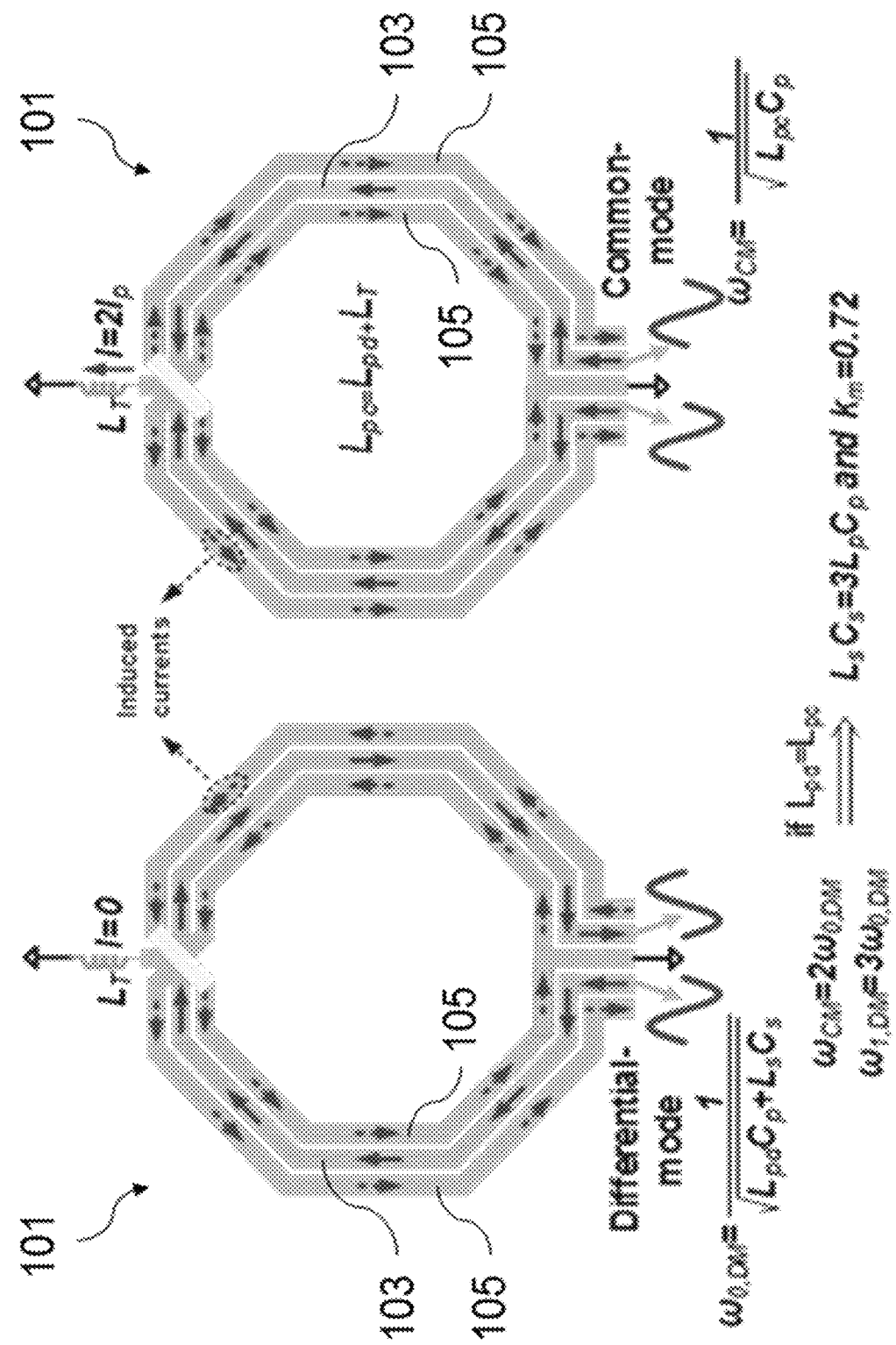
FIG. 5 shows a transformer comprising a primary winding and a secondary winding according to an embodiment.

FIG. 5 shows a transformer 101 comprising a primary winding 103 and a secondary winding 105 according to an embodiment. The diagram illustrates the currents within the primary winding 103 and the secondary winding 105 when the transformer 101 is excited in differential mode (DM) and in common mode (CM). The transformer 101 can be an $F_{2,3}$ transformer.

The primary winding 103 of the transformer 101 and the secondary winding 105 of the transformer 101 are planar and are arranged on the same plane. The secondary winding 105 of the transformer 101 comprises a bridging portion being arranged at a different plane.

The primary winding 103 of the transformer 101 and the secondary winding 105 of the transformer 101 are connected to a supply voltage or an alternating current (AC) ground potential. The connection is realized by a symmetrical center tapping of the primary winding 103 and the secondary winding 105.

The transformer 101, having a 1:2 turn ratio, can be excited by differential mode and common mode input signals at its primary winding 103. In differential mode excitation, the induced currents at the secondary winding 105 can circulate in the same directions leading to a strong coupling factor $k_m$. On the other hand, in common mode excitation, the induced currents can cancel each other, resulting in a weak coupling factor $k_m$.

The inductance of the primary winding 103 can be referred to as $L_p$, the inductance of the secondary winding 105 can be referred to as $L_s$, the capacitance of the primary capacitor 107 can be referred to as $C_p$, and the capacitance of the secondary capacitor 109 can be referred to as $C_s$. According to this definition, the primary winding 103, the secondary winding 105, the primary capacitor 107, and the secondary capacitor 109 are considered as individual concentrated components.

Alternatively, the inductance of the primary winding 103 can be referred to as $2 L_p$, the inductance of the secondary winding 105 can be referred to as $2 L_s$, the capacitance of the primary capacitor 107 can be referred to as $0.5 C_p$, and the capacitance of the secondary capacitor 109 can be referred to as $0.5 C_s$. According to this definition, the primary winding 103 and the secondary winding 105 are each formed by a pair of inductors connected in series, wherein the inductance of each inductor is referred to as $L_p$ or $L_s$, respectively. Furthermore, the primary capacitor 107 and the secondary capacitor 109 are each formed by a pair of capacitors connected in series, wherein the capacitance of each capacitor is referred to as $C_p$ or $C_s$, respectively.

The differential mode resonance frequency can be determined according to the following equation:

$$\omega_{0,DM} = \frac{1}{\sqrt{L_{pd}C_p + L_sC_s}}$$

wherein $\omega_{0,DM}$ denotes the differential mode resonance frequency, $L_{pd}$ denotes an inductance associated with the primary winding 103 in differential mode, $C_p$ denotes a capacitance associated with a primary capacitor 107, $L_s$ denotes an inductance associated with the secondary winding 105, and $C_s$ denotes a capacitance associated with a secondary capacitor 109.

The common mode resonance frequency can be determined according to the following equation:

$$\omega_{CM} = \frac{1}{\sqrt{L_{pc}C_p}}$$

wherein $\omega_{CM}$ denotes the common mode resonance frequency, $L_{pc}$ denotes an inductance associated with the primary winding 103 in common mode, and $C_p$ denotes a capacitance associated with a primary capacitor 107.

$L_{pd}$ can relate to half of the inductance of the primary winding 103 in differential mode, e.g. the inductance between a center tap of the primary winding 103 and one of the inputs, yielding a total differential primary capacitance of $2 L_p$. This is due to the consideration that the inductance $L_T$ may not be seen in differential excitation but may affect the inductance in common mode excitation. The total inductance in common mode excitation can be equal to $2 L_{pd}+2 L_T$, or $L_{pc}=L_{pd}+L_T$ as used in the equations.

In an embodiment, the inductance associated with the primary winding 103 in differential mode and the inductance associated with the primary winding 103 in common mode are considered to be equal.

Figure 6:
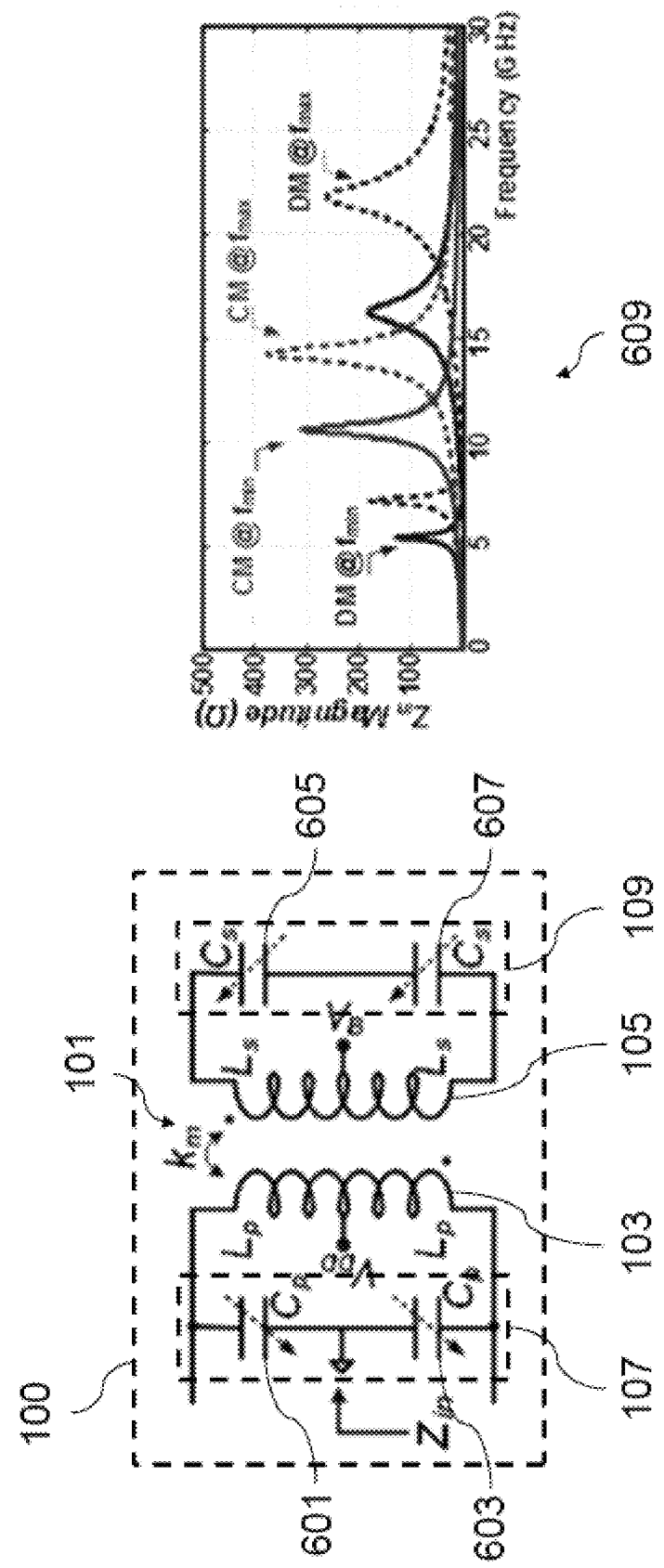
FIG. 6 shows a resonator circuit and an input impedance response according to an embodiment.

FIG. 6 shows a resonator circuit 100 and an input impedance response 609 according to an embodiment. The resonator circuit 100 comprises a transformer 101 comprising a primary winding 103 and a secondary winding 105, wherein the primary winding 103 is inductively coupled with the secondary winding 105, a primary capacitor 107 being connected to the primary winding 103, the primary capacitor 107 and the primary winding 103 forming a primary circuit, and a secondary capacitor 109 being connected to the secondary winding 105, the secondary capacitor 109 and the secondary winding 105 forming a secondary circuit, wherein the resonator circuit 100 has a common mode resonance frequency at an excitation of the primary circuit in a common mode, wherein the resonator circuit 100 has a differential mode resonance frequency at an excitation of the primary circuit in a differential mode, and wherein the common mode resonance frequency is different from the differential mode resonance frequency. FIG. 6 shows a possible realization of the resonator circuit 100.

The primary capacitor 107 of the primary circuit comprises a pair of single-ended capacitors 601, 603. The secondary capacitor 109 of the secondary circuit comprises a pair of differential capacitors 605, 607. The primary capacitor 107 and the secondary capacitor 109 are variable capacitors, in particular digitally tunable capacitors. In particular, the pair of single-ended capacitors 601, 603 and the pair of differential capacitors 605, 607 are variable capacitors, in particular digitally tunable capacitors. The differential mode resonance frequency and/or the common mode resonance frequency are tunable between a minimum frequency $f_{min}$ and a maximum frequency $f_{max}$, respectively, as illustrated by the input impedance response 609. The input impedance of the resonator circuit 100 is denoted as $Z_{in}$.

The resonator circuit 100 can employ the transformer 101, the pair of single-ended capacitors 601, 603 within the primary circuit and the pair of differential capacitors 605, 607 within the secondary circuit. The resonator circuit 100 can be an $F_{2,3}$ resonator circuit. The transformer 101 can be an $F_{2,3}$ transformer. The resonator circuit 100 can have two differential mode resonance frequencies and one common mode resonance frequency.

For class-$F_3$ operation, $\omega_{1,DM}=3\omega_{0,DM}$, and for resistive traps at the second and third harmonics, $\omega_{CM}=2\omega_{0,DM}$ and $\omega_{1,DM}=3\omega_{0,DM}$. This can result in $L_sC_s=3L_pC_p$ and $k_m=0.72$, wherein $k_m$ denotes the coupling factor between the primary winding 103 and the secondary winding 105.

When implementing the resonator circuit 100, the inductance associated with the primary winding 103 in common mode $L_{pc}$ can be greater than the inductance associated with the primary winding 103 in differential mode $L_{pd}$, i.e. $L_{pc}>L_{pd}$, due to a metal track inductance $L_T$ connecting e.g. a center tap of the primary winding 103 to a constant supply voltage. Thus, a lower coupling factor $k_m$ may be used in order to satisfy both $F_2$ and $F_3$ operation conditions of the resonator circuit 100. A careful design of the single-ended capacitors 601, 603 within the primary circuit and/or the differential capacitors 605, 607 within the secondary circuit, which can be variable capacitors, can maintain $\omega_{CM}/\omega_{0,DM} \approx 2$ and $\omega_{1,DM}/\omega_{0,DM} \approx 3$ over the full tuning range (TR).

In an embodiment, the inductance associated with the primary winding 103 in common mode $L_{pc}$ is determined according to the following equation:

$$L_{pc} = L_{pd} + L_T$$

wherein $L_{pc}$ denotes the inductance associated with the primary winding 103 in common mode, $L_{pd}$ denotes the inductance associated with the primary winding 103 in differential mode, and $L_T$ denotes the metal track inductance.

Figure 7:
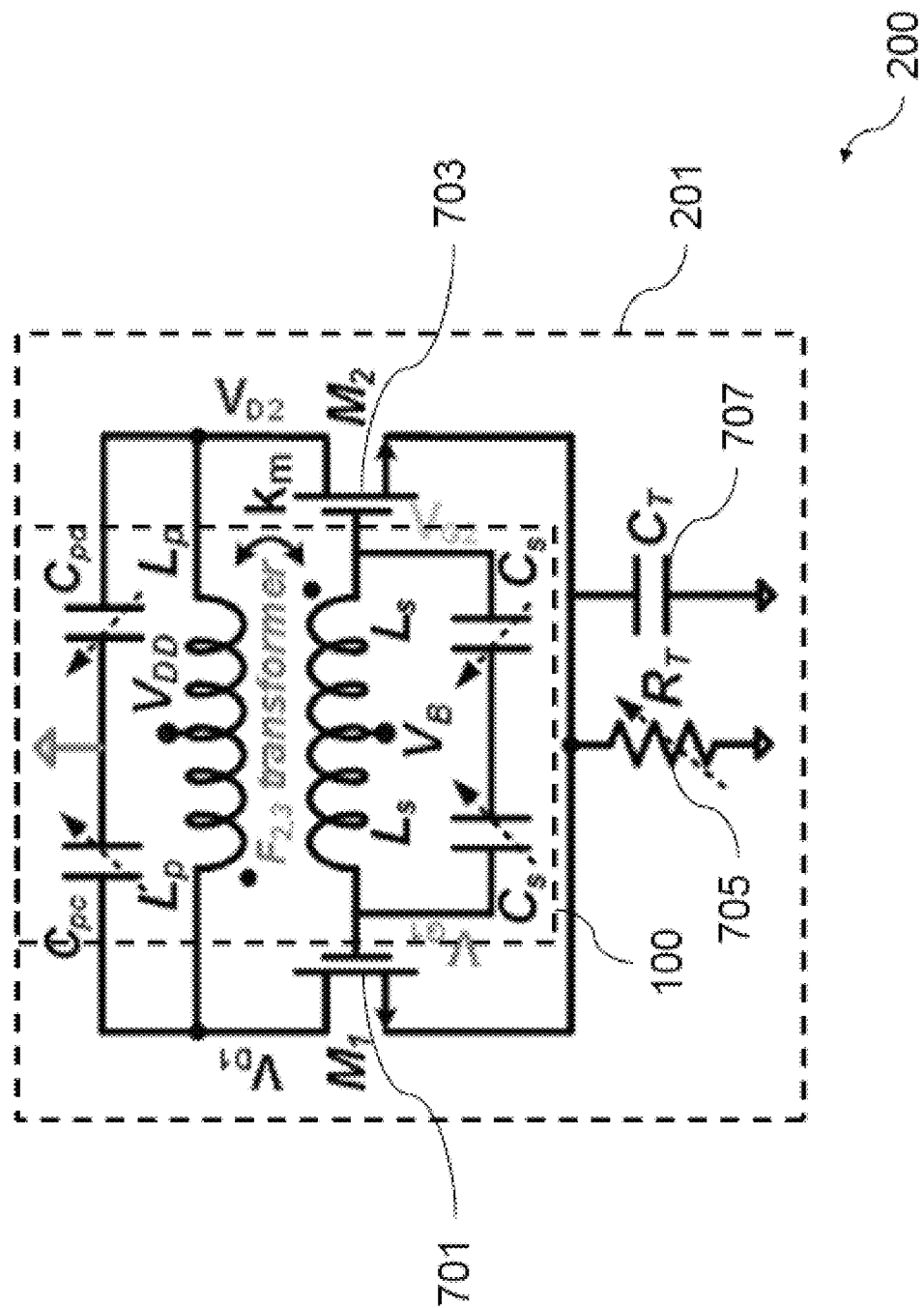
FIG. 7 shows a diagram of a radio frequency oscillator according to an embodiment.

FIG. 7 shows a diagram of a radio frequency oscillator 200 according to an embodiment. The radio frequency oscillator 200 comprises a resonator circuit 100, and an excitation circuit 201. The resonator circuit 100 forms an implementation of the resonator circuit 100 as described in conjunction with FIG. 6. The excitation circuit 201 comprises a transistor 701, a transistor 703, a tail resistor 705, and a tail capacitor 707. The radio frequency oscillator 200 is a class F oscillator.

Class $F_3$ oscillators can have a pseudo square-wave oscillation waveform by designing $\omega_{1,DM} = 3\omega_{0,DM}$, and avoiding filtering the current $I_{H3}$ in a resonator circuit. The specific impulse sensitivity function (ISF) of the pseudo square-wave oscillation waveform can lead to an improved phase noise performance. In this oscillator, the current $I_{H2}$ can be as high as the current $I_{H3}$. In a class $F_{2,3}$ oscillator, a class $F_3$ resonator circuit is replaced by a class $F_{2,3}$ resonator circuit. The pseudo square-wave oscillation waveform of class F oscillators can be preserved, wherein a $1/f^3$ phase noise corner frequency can be reduced e.g. from 300 kHz to 700 kHz to less than 30 kHz. Embodiments of the invention use an $F_{2,3}$ resonator circuit and the different characteristics of a 1:2 turn transformer in differential mode and common mode excitations in order to provide a resistive trap at the second harmonic $2\omega_0$, resulting in a reduction of flicker noise up-conversion in radio frequency oscillators.

Figure 8:
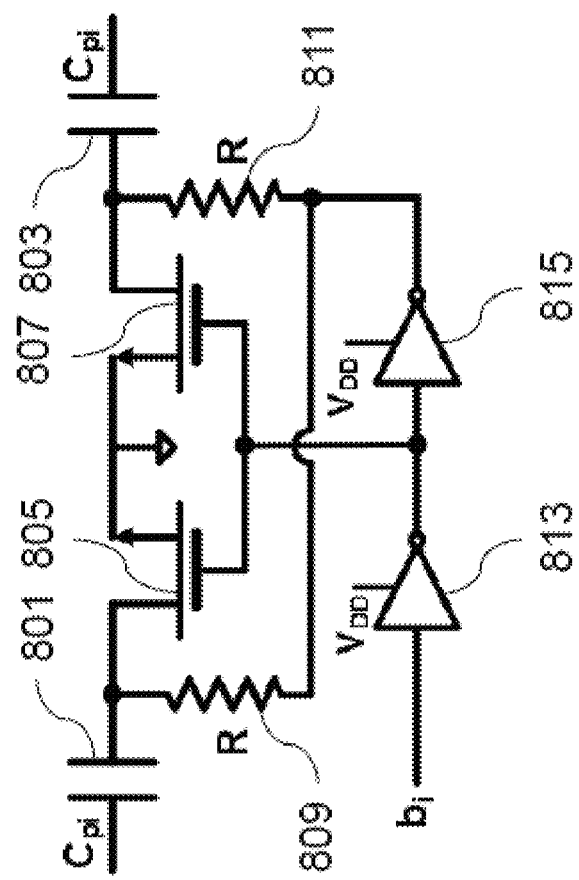
FIG. 8 shows a diagram of a single-ended capacitor according to an embodiment.

FIG. 8 shows a diagram of a single-ended capacitor 601, 603 according to an embodiment. The single-ended capacitor 601, 603 comprises a capacitor 801, a capacitor 803, a transistor 805, a transistor 807, a resistor 809, a resistor 811, an inverter 813, and an inverter 815. The single-ended capacitor 601, 603 is arranged within the primary circuit.

By applying a digital switching signal $b_i$, the transistor 805 and the transistor 807 can be switched between a conducting state and a non-conducting state. Consequently, the capacitance of the single-ended capacitor 601, 603 can be digitally tuned. A plurality of single-ended capacitors 601, 603 can be connected in parallel.

Figure 9:
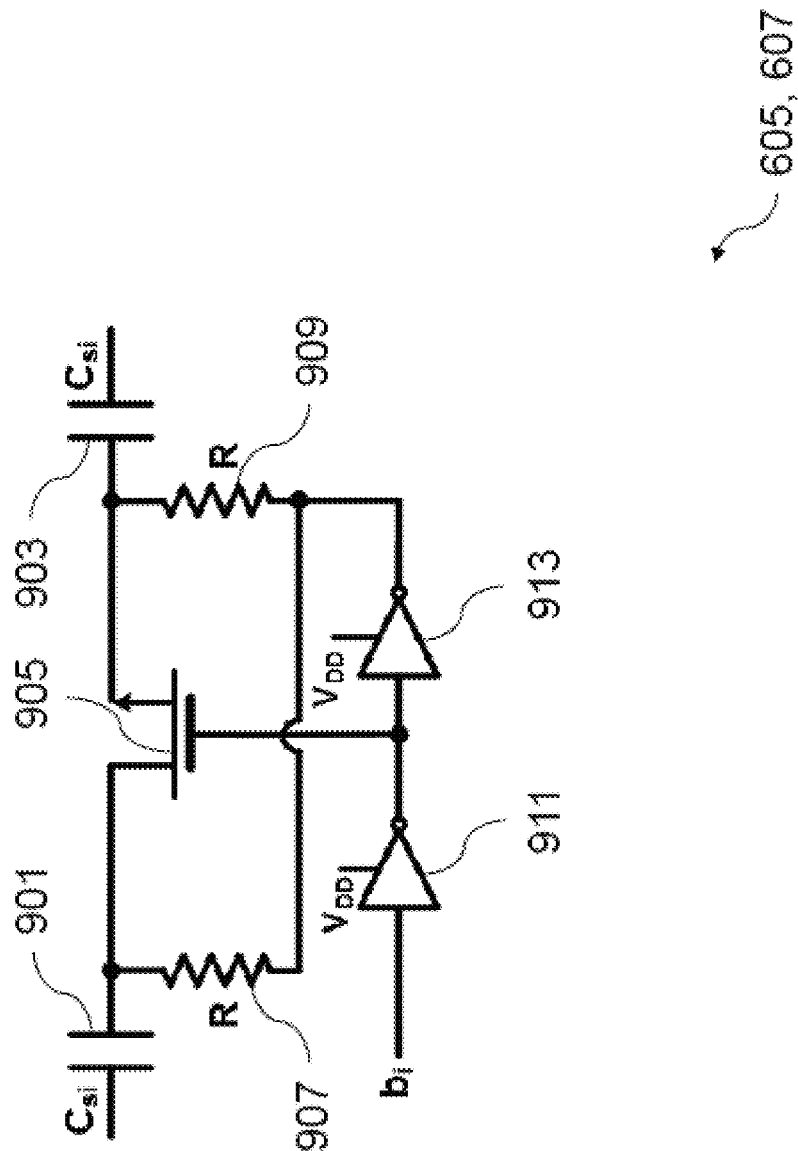
FIG. 9 shows a diagram of a differential capacitor according to an embodiment.

FIG. 9 shows a diagram of a differential capacitor 605, 607 according to an embodiment. The differential capacitor 605, 607 comprises a capacitor 901, a capacitor 903, a transistor 905, a resistor 907, a resistor 909, an inverter 911, and an inverter 913. The differential capacitor 605, 607 is arranged within the secondary circuit.

By applying a digital switching signal $b_i$, the transistor 905 can be switched between a conducting state and a non-conducting state. Consequently, the capacitance of the differential capacitor 605, 607 can be digitally tuned. A plurality of differential capacitors 605, 607 can be connected in parallel.

Figure 10:
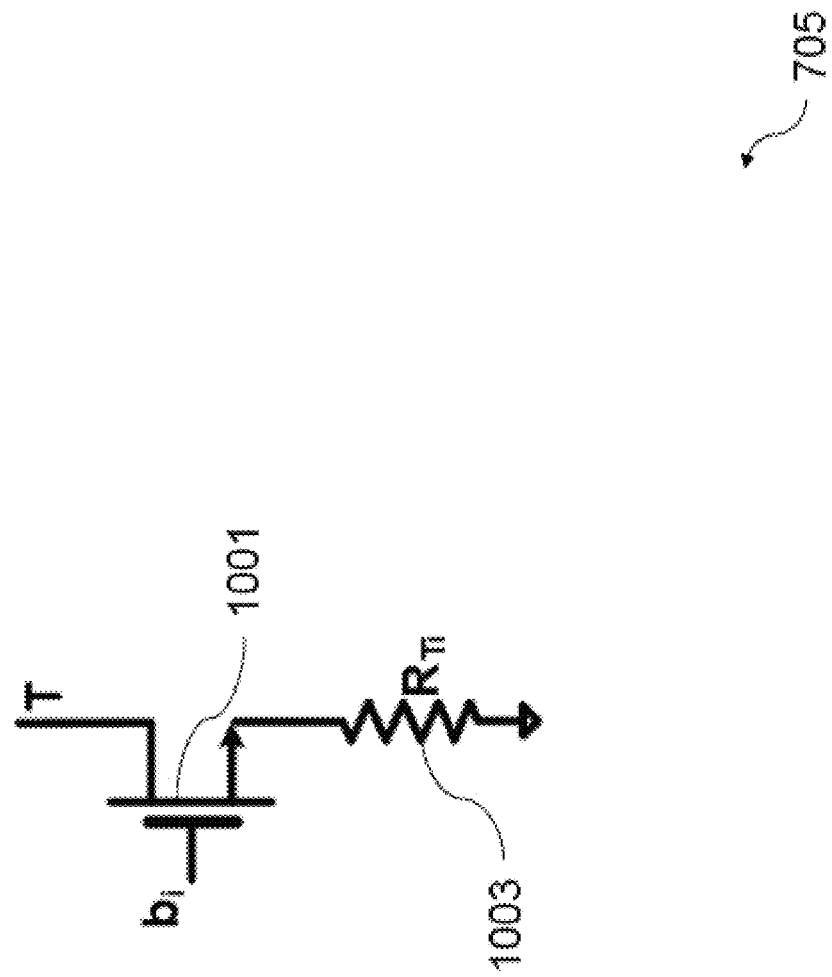
FIG. 10 shows a diagram of a tail resistor of a radio frequency oscillator according to an embodiment.

FIG. 10 shows a diagram of a tail resistor 705 of a radio frequency oscillator 200 according to an embodiment. The tail resistor 705 comprises a transistor 1001, and a resistor 1003. The tail resistor 705 can be used for current control within the radio frequency oscillator 200.

By applying a digital switching signal $b_i$, the transistor 1001 can be switched between a conducting state and a non-conducting state. Consequently, the current within the radio frequency oscillator 200 can be controlled. A plurality of tail resistors 705 can be connected in parallel and/or in series.

Figure 11:
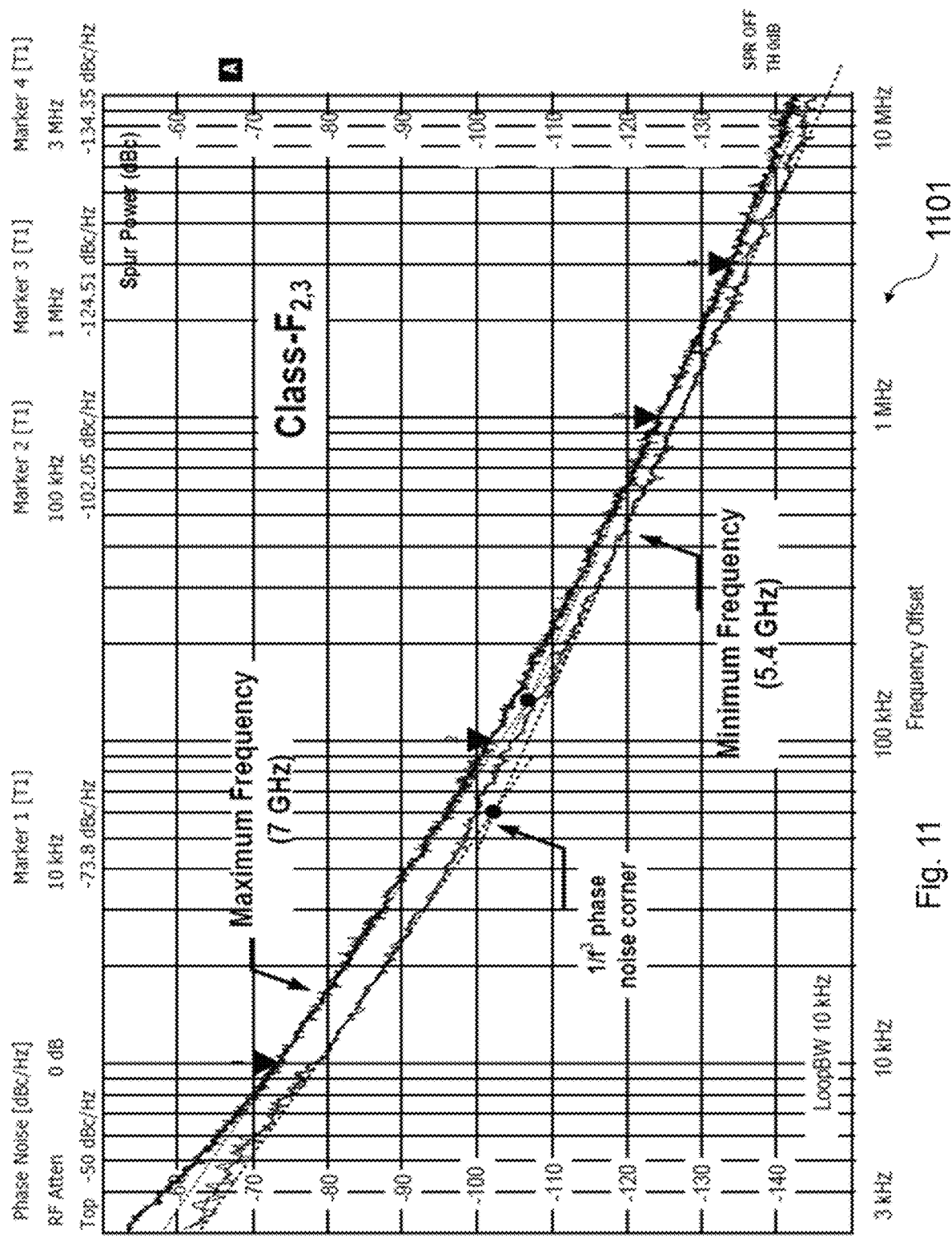
FIG. 11 shows a phase noise power spectral density of a radio frequency oscillator according to an embodiment.

FIG. 11 shows a phase noise power spectral density 1101 of a radio frequency oscillator 200 according to an embodiment. The diagram depicts the phase noise power spectral density in dBc/Hz over a carrier frequency offset in Hz. The radio frequency oscillator 200 is a class $F_{2,3}$ oscillator.

The diagram relates to a minimum frequency of 5.4 GHz and a maximum frequency of 7 GHz. A $1/f^3$ phase noise corner is further depicted in the diagram.

It will be appreciated that statements made herein characterizing the invention refer to an embodiment of the invention and not necessarily all embodiments.

What is claimed is:

1. A resonator circuit, comprising:
 a transformer comprising a primary winding and a secondary winding, wherein the primary winding is inductively coupled with the secondary winding, and wherein a ratio of turns of the primary winding to turns of the secondary winding is 1:2;
 a primary capacitor connected to the primary winding, the primary capacitor and the primary winding forming a primary circuit; and
 a secondary capacitor connected to the secondary winding, the secondary capacitor and the secondary winding forming a secondary circuit;
 wherein the resonator circuit has a common mode resonance frequency at an excitation of the primary circuit in a common mode, wherein the resonator circuit has a differential mode resonance frequency at an excitation of the primary circuit in a differential mode, wherein the common mode resonance frequency is different from the differential mode resonance frequency, and wherein an inductive coupling factor of the transformer in the differential mode is stronger than an inductive coupling factor of the transformer in the common mode.

2. The resonator circuit of claim 1, wherein the common mode resonance frequency is twice the differential mode resonance frequency.

3. The resonator circuit of claim 1, wherein the resonator circuit has a further differential mode resonance frequency at an excitation of the primary circuit in the differential mode, wherein the further differential mode resonance frequency is different from the differential mode resonance frequency and the common mode resonance frequency.

4. The resonator circuit of claim 3, wherein the further differential mode resonance frequency is three times the differential mode resonance frequency.

5. The resonator circuit of claim 1, wherein the primary winding of the transformer comprises one turn, and wherein the secondary winding of the transformer comprises two turns.

6. The resonator circuit of claim 1, wherein the primary winding of the transformer or the secondary winding of the transformer is planar.

7. The resonator circuit of claim 1, wherein the primary winding of the transformer and the secondary winding of the transformer are arranged on the same plane.

8. The resonator circuit of claim 1, wherein the primary winding of the transformer or the secondary winding of the transformer is connected to a constant voltage source or a ground potential.

9. The resonator circuit of claim 1, wherein the primary capacitor of the primary circuit comprises a pair of single-ended capacitors.

10. The resonator circuit of claim 1, wherein the secondary capacitor of the secondary circuit comprises a pair of differential capacitors.

11. The resonator circuit of claim 1, wherein the primary capacitor or the secondary capacitor comprises a variable capacitor.

12. The resonator circuit of claim 1, wherein the primary capacitor is connected in parallel to the primary winding.

13. A radio frequency oscillator, comprising:
a resonator circuit, comprising:
  a transformer comprising a primary winding and a secondary winding, wherein the primary winding is inductively coupled with the secondary winding, and wherein a ratio of turns of the primary winding to turns of the secondary winding is 1:2;
  a primary capacitor connected to the primary winding, the primary capacitor and the primary winding forming a primary circuit; and
  a secondary capacitor connected to the secondary winding, the secondary capacitor and the secondary winding forming a secondary circuit;
wherein the resonator circuit has a common mode resonance frequency at an excitation of the primary circuit in a common mode, wherein the resonator circuit has a differential mode resonance frequency at an excitation of the primary circuit in a differential mode, and wherein the common mode resonance frequency is different from the differential mode resonance frequency;
wherein an inductive coupling factor of the transformer in the differential mode is stronger than an inductive coupling factor of the transformer in the common mode; and
an excitation circuit configured to excite the primary circuit of the resonator circuit in the differential mode.

14. The radio frequency oscillator of claim 13, wherein the excitation circuit comprises at least one transistor for exciting the primary circuit of the resonator circuit.

15. The radio frequency oscillator of claim 13, wherein the radio frequency oscillator is a class F oscillator.

16. The radio frequency oscillator of claim 14, wherein the at least one transistor comprises at least one field-effect transistor.

17. The resonator circuit of claim 11, wherein the variable capacitor is a digitally-tunable capacitor.

18. The resonator circuit of claim 1, wherein the secondary capacitor is connected in parallel to the secondary winding.

* * * * *